(12) United States Patent
Lee

(10) Patent No.: US 8,253,876 B2
(45) Date of Patent: Aug. 28, 2012

(54) LIQUID CRYSTAL DISPLAY DEVICE WITH ENHANCED STABILITY

(75) Inventor: Dae-Myung Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 704 days.

(21) Appl. No.: 12/326,813

(22) Filed: Dec. 2, 2008

(65) Prior Publication Data
US 2009/0185102 A1 Jul. 23, 2009

(30) Foreign Application Priority Data

Jan. 18, 2008 (KR) .................. 10-2008-0005507

(51) Int. Cl.
*G02F 1/1333* (2006.01)
*G02F 1/1345* (2006.01)

(52) U.S. Cl. ............. 349/58; 349/59; 349/149; 349/150

(58) Field of Classification Search ............... 349/58, 349/59, 149, 150
See application file for complete search history.

(56) References Cited

U.S. PATENT DOCUMENTS

| 2003/0223020 A1* | 12/2003 | Lee | 349/58 |
| 2004/0183959 A1* | 9/2004 | Ishida | 349/58 |
| 2004/0257515 A1* | 12/2004 | Lee | 349/150 |

FOREIGN PATENT DOCUMENTS

| JP | 2001-188222 | 7/2001 |
| JP | 2006-113480 | 4/2006 |
| KR | 2007-0079428 | 8/2007 |

* cited by examiner

*Primary Examiner* — Michael Caley
(74) *Attorney, Agent, or Firm* — Innovation Counsel LLP

(57) ABSTRACT

Embodiments of the present disclosure provide a liquid crystal display device having a liquid crystal display panel for displaying images, a lower receiving member for receiving the liquid crystal display panel, and a source PCB disposed on a side of the lower receiving member to supply a driving signal to the liquid crystal display panel. The liquid crystal display device includes a shield case arranged on rear surface of the lower receiving member. The shield case includes a body that protects a driving board, a fixing portion that fixes the source PCB to the lower receiving member, and a connection portion that connects the body to the fixing portion. The connection portion extends from an edge of the shield case. The liquid crystal display device includes an upper receiving member that combines with the lower receiving member to cover the liquid crystal display panel.

17 Claims, 7 Drawing Sheets

LIQUID CRYSTAL DISPLAY DEVICE WITH ENHANCED STABILITY

CROSS-REFERENCE TO RELATED APPLICATIONS

This application claims priority to and the benefit of Korean Patent Application No. 10-2008-0005507 filed in the Korean Intellectual Property Office on Jan. 18, 2008, the disclosure of which is incorporated herein by reference in its entirety.

BACKGROUND

1. Field of the Invention

The present invention relates to a liquid crystal display device having improved display quality.

2. Description of the Related Art

Presently, high performance displays are adapted to display various data, such as images, graphics and text. Modern liquid crystal display (LCD) devices have low power consumption, small and compact designs, and reduced harmful electromagnetic wave radiation. LCD devices display images by the adjustment of light transmittance of liquid crystal molecules using electric fields. An LCD device includes an LCD panel for displaying images and a driver for driving the LCD panel. Some LCD devices include an LCD panel, a panel driver, a backlight assembly, a bottom chassis, a middle mold, and an upper receiving member.

The panel driver includes a driving integrated circuit (IC) for driving gate lines and data lines of the LCD panel, a timing controller for controlling the driving IC, and a power supply for supplying power signals to the LCD panel and the driving IC. The timing controller and power supply are mounted on a printed circuit board (PCB) to supply data signals to the LCD panel. A source PCB having various components is electrically connected to the LCD panel through a tape carrier package (TCP). However, movement of the source PCB may cause a short circuit between the components and their neighboring conductors, which degrades the quality of the LCD device.

SUMMARY

Embodiments of the present disclosure provide an LCD device with improved display quality. Moreover, embodiments of the present disclosure provide an improved method of manufacturing an LCD device.

One embodiment of the present disclosure provides a liquid crystal display device including a liquid crystal display panel that displays images, a lower receiving member that receives the liquid crystal display panel, and a source PCB seated on a side of the lower receiving member to supply a driving signal to the liquid crystal display panel. The liquid crystal display device includes a shield case arranged on a rear surface of the lower receiving member, wherein the shield case includes a body that protects a driving board on which a component is mounted to supply a driving signal to the source PCB, a fixing portion that fixes the source PCB to the lower receiving member, and a connection portion that connects the body to the fixing portion. The liquid crystal display device includes an upper receiving member combined with the lower receiving member to cover the liquid crystal display panel, wherein the connection portion is extended from an edge of the shield case.

In various implementations, the shield case may include a coupling portion that contacts the upper receiving member. The coupling portion may extend from an end of the fixing portion. The coupling portion may be formed between the connection portion and the fixing portion. The source PCB may include a seating groove on which the fixing portion rests. The fixing portion pressurizes the source PCB to fix it. The fixing portion has a rounded bend. The source PCB may include a ground portion, and the ground portion may be brought in contact with the fixing portion when the source PCB is seated on the side of the lower receiving member. The connection portion may extend from a portion between both ends of a top edge of the shield case. The liquid crystal display device may include a backlight assembly seated in the lower receiving member and a frame wrapping around an outer surface of the lower receiving member to prevent the backlight assembly from coming off.

Embodiments of the present disclosure provide a method of manufacturing a liquid crystal display device. The method includes combining a shield case to a lower receiving member, wherein the shield case includes a body that protects a driving board on which a component is mounted to supply a driving signal to a source PCB, a fixing portion that fixes the source PCB to the lower receiving member, and a connection portion that connects the body to the fixing portion. The method includes placing the source PCB between the fixing portion and a side of the lower receiving member and combining the lower receiving member with an upper receiving member.

BRIEF DESCRIPTION OF THE DRAWINGS

The above and other features of the present disclosure will be described in reference to various embodiments presented herein with reference to the attached drawings.

DETAILED DESCRIPTION

Figure 1:
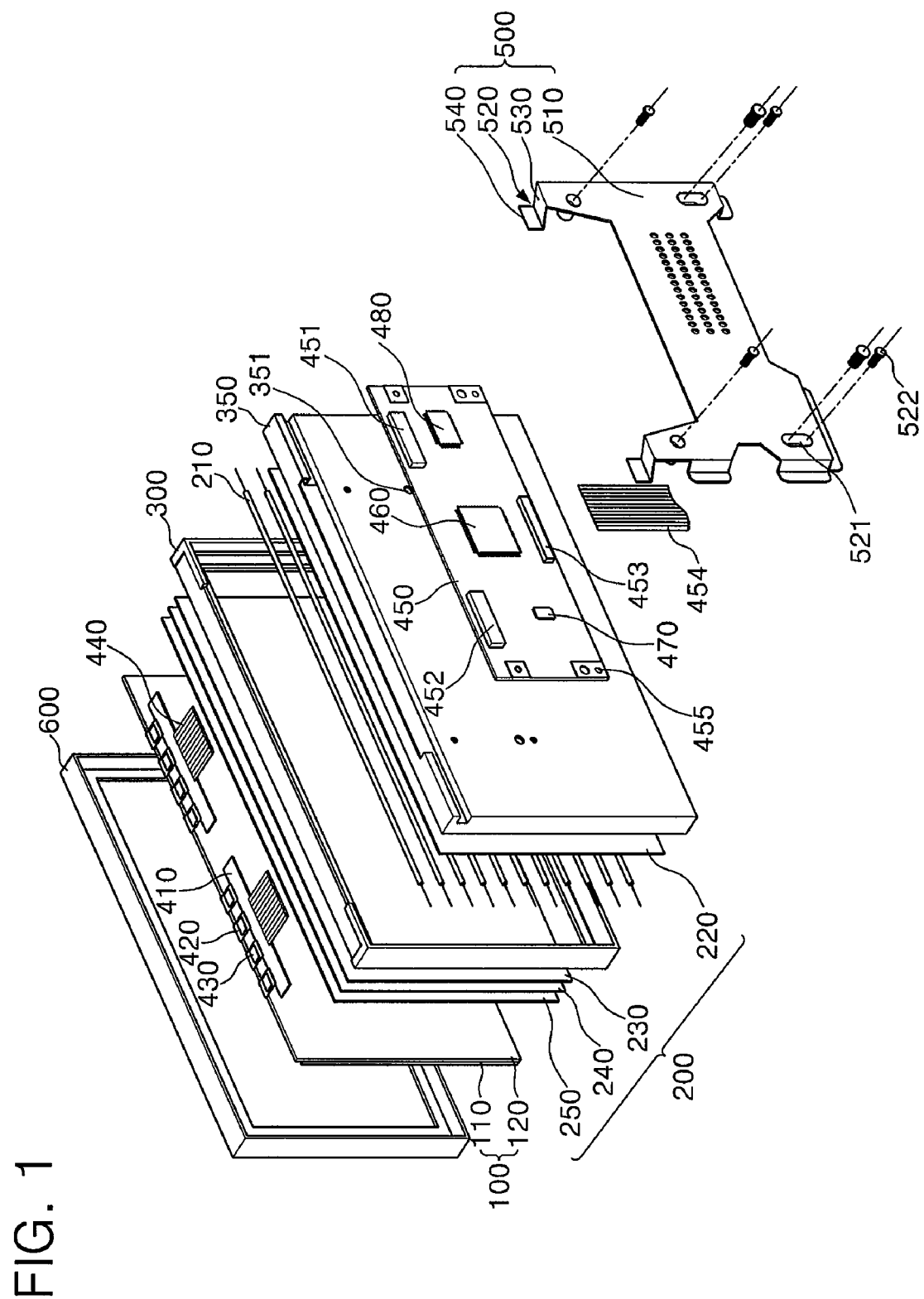
FIG. 1 is an exploded perspective view of an LCD device according to an embodiment of the present disclosure.

Embodiments of the present dislcosure now will be described more fully hereinafter with reference to the accompanying drawings. The present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like reference numerals refer to like elements throughout.

It will be understood that when an element is referred to as being "on" another element, it may be directly on the other element or intervening elements may be present therebetween. In contrast, when an element is referred to as being "directly on" another element, there are no intervening elements present. As used herein, the term "and/or" includes any and all combinations of one or more of the associated listed items.

It should be understood that, although the terms first, second, third, etc. may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below may be termed a second element, component, region, layer or section without departing from the scope of the present disclosure.

The terminology used herein is for the purpose of describing particular embodiments and is not intended to limit the disclosure. As used herein, the singular forms "a", "an" and "the" are intended to include the plural forms as well, unless the context clearly indicates otherwise. It should be understood that the terms "includes" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Moreover, relative terms, such as "lower" or "bottom" and "upper" or "top," may be used herein to describe one element's relationship to other elements, as shown in the Figures. It should be understood that relative terms are intended to encompass different orientations of the device in addition to the orientation depicted in the Figures. For example, if the device in one of the figures is turned over, elements described as being on the "lower" side of other elements should then be oriented on "upper" sides of the other elements. Therefore, the term "lower" may encompasse both an orientation of "lower" and "upper," depending on a particular orientation of the Figure. Similarly, if the device in one of the figures is turned over, elements described as "below" or "beneath" other elements should be oriented "above" the other elements. The terms "below" or "beneath" may, therefore, encompass both an orientation of above and below. The device may be otherwise oriented (e.g., rotated 90 degrees or at other orientations), and the spatially relative descriptors used herein interpreted accordingly.

Unless otherwise defined, all terms (including technical and scientific terms) used herein have the same meaning as commonly understood by one of ordinary skill in the art. It should be understood that terms, such as those defined in commonly used dictionaries, should be interpreted as having a meaning that is consistent with their meaning in the context of the relevant art and the present disclosure and may not be interpreted in an idealized or overly formal sense unless expressly so defined herein.

Embodiments of the present disclosure are described herein with reference to cross-section illustrations that are schematic illustrations of idealized embodiments of the present disclosure. As such, variations from the shapes of the illustrations as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present disclosure.

FIG. 1 is an exploded perspective view of an LCD device according to one embodiment of the present disclosure. Referring to FIG. 1, the LCD device includes an LCD panel 100, a panel driver (not shown), a backlight assembly 200, a lower receiving member 350, a shield case 500 and an upper receiving member 600.

The LCD panel 100 includes, in one embodiment, a thin film transistor (TFT) substrate 120 and a color filter substrate 110 that are attached to each other with a liquid crystal layer interposed therebetween. The color filter substrate 110 includes a black matrix that prevents light leakage, a color filter reproducing color and a common electrode.

The TFT substrate 120 includes, in one embodiment, a gate line and a data line that extend substantially perpendicularly to each other, a TFT formed near the intersection of the gate line and data line, and a pixel electrode electrically connected to the TFT.

The panel driver includes, in one embodiment, a gate driver (not shown) which drives the gate line and a data driver 400 which drives the data line. The gate driver may include, in one embodiment, a gate PCB and a gate IC, and the gate IC is mounted on a tape carrier package (TCP). The TCP is formed between the gate PCB and TFT substrate 120.

In one implementation, the gate IC may supply gate-high scan signals to the gate lines, and the gate IC may also supply gate-low scan signals to the gate lines, but not, in one example, during the supply of the gate-high scan signals. Control signals and power signals are supplied through signal lines from the timing controller 460 and the power supply 480, respectively, which are mounted on a driving board 450.

The data driver 400 includes, in one embodiment, a source PCB 410 and a data IC 430 formed on a data TCP 420. The data TCP 420 is formed between the source PCB 410 and the TFT substrate 120.

In one implementation, the data IC 430 converts pixel data into analogue pixel signals and supplies the converted analog pixel signals to the data lines. The source PCB 410 supplies control signals, power signals, and pixel data from the timing controller 460 and the power supply 480 to the data IC 430. In a large screen LCD device, for example, the timing controller 460 and the power supply 480 may be mounted on a separate PCB (i.e. the driving board 450), which is electrically connected to the source PCB 410. The source PCB 410 is electrically connected to the data TCP 420 and electrically connected through a first signal transmission film 440 to the driving board 450. Accordingly, the source PCB 410 supplies control signals, power signals and pixel data from the timing controller 460 and the power supply 480 to the data IC 430.

The backlight assembly 200 includes, in one embodiment, a lamp 210, a reflective sheet 220 and an optical sheet. The lamp 210 generates light using an external power supply and directs the light toward the LCD panel 100. The lamp 210 may be provided in plurality under the LCD panel 100, resulting in what is commonly referred to as a "direct type backlight assembly." In one implementation, the direct type backlight assembly may escape the use of a separate light guide plate that is inevitable to an edge type backlight assembly which supplies light from a side of the light guide plate because the direct type backlight assembly may directly supply light toward the LCD panel 100. This may simplify, for example, the manufacturing process of the LCD device.

The reflective sheet 220, which is arranged under the lamp 210, reflects the light directed toward the lamp 210 back to the LCD panel 100. The reflective sheet 220 comprises, in one embodiment, a reflective, light-diffusive material in its inside to reflect and diffuse the light that travels away from the LCD panel 100.

The optical sheet includes, in one embodiment, a diffusion sheet 230, a prism sheet 240 and a protective sheet 250 that are sequentially disposed over the lamp 210. The diffusion sheet 230 serves to diffuse light, the prism sheet 240 serves to redirect the incident light toward the LCD panel 100, and the protective sheet 250 serves to protect the surface of the prism sheet 240. Although the invention is herein described as including one diffusion sheet 230, one prism sheet 240 and one protective sheet 250 are used herein, but the present disclosure is not limited thereto. For example, each sheet may be provided in plurality according to the characteristics of the LCD device.

In one embodiment, the lower receiving member 350 serves to accommodate the backlight assembly 200 therein and provide protection. In one embodiment, the frame 300, located between the upper receiving member 600 and the lower receiving member 350, wraps around the lower receiving member 350 to insulate the upper receiving member 600 from the lower receiving member 350. In one embodiment, the source PCB 420 is seated on a side of the lower receiving member 350, and the driving board 450, which is electrically connected to the source PCB 420 through the first signal transmission film 440, is combined to the rear side of the lower receiving member 350 with a coupling member 522 passing through second and third penetration holes 351 and 455.

The driving board 450 includes, in one embodiment, a signal transmission layer and a protective film to protect signal transmission layer. Signal lines are formed by patterning a metal thin film on the signal transmission layer of a base substrate, and the protective film is stacked on the signal transmission layer. The driving board 450 includes on one side the timing controller 460, memory 470 and power supply 480.

In one implementation, the power supply 480 generates and supplies gate-on voltages and gate-off voltages to the gate driver and analog driving voltages to the data IC 430. The timing controller 460 generates control signals, such as start pulses, shift clocks and output control signals, and supplies them to the gate driver and data IC 430. Moreover, the timing controller 460 supplies image signals from external circuit (not shown) to the data IC 430.

In one implementation, the memory 470 stores the data signals of previous frames supplied from the timing controller 460 and supplies them to the timing controller 460 in synchronization with the supply of the data signals of a current frame. The driving board 450 may include a first connector 451, a second connector 452 and a third connector 453. The first and second connectors 451 and 452 are electrically connected to the first signal transmission film 440 that supplies control signals, power signals and pixel data generated from the driving board 450 to the source PCB 410. The third connector 453 is electrically connected to a second signal transmission film 454 which supplies image signals from an external component (not shown) to the driving board 450.

In one implementation, the driving board 450 receives externally supplied pixel data and power signals through the second signal transmission film 454, and the second signal transmission film 454 is electrically connected to the third connector 453. The timing controller 460 generates control signals. The power signals, control signals, and pixel data are supplied to the source PCB 410 through the first signal transmission film 440. The two first signal transmission films 440 are attached to the rear side of the source PCB 410 and inserted into the first and second connectors 451 and 452 of the driving board 450. The second signal transmission film 454 is electrically connected to an external power supply device (not shown) and a graphic controller (not shown) and inserted into the third connector 454 of the driving board 450.

In one implementation, the first and second signal transmission films 440 and 454 may include a flexible printed circuit board (FPCB) on which signal transmission lines, a connection pad and a protective film have been sequentially stacked. The signal transmission lines may be formed by patterning a metal thin film on a base film.

In one embodiment, the shield case 500 may be formed of metal to provide the physical and electrical protection of the timing controller 460, memory 470 and power supply 480. The shield case 500 includes, in one embodiment, a body 510 that protects the driving board 450, a fixing portion 520 that fixes the source PCB 410, a connection portion 530 that connects the body 510 with the fixing portion 520 and a coupling portion 540.

The body 510 includes, in one embodiment, a first penetration hole 521. The driving board 450 includes, in one embodiment, a second penetration hole 455. The lower receiving member 350 includes, in one embodiment, a third penetration hole 351. The coupling member 522 goes through the first to third penetration holes 521, 455, and 351 to combine the body 510, the driving board 450 and the lower receiving member 350 to each other. The connection portion 530 and the fixing portion 520 are pressurized against the side of the lower receiving member 350 when the shield case 500 is combined to the lower receiving member 350. Accordingly, in one implementation, when the source PCB 410 is arranged between the lower receiving member 350 and the fixing portion 520, the source PCB 410 may be firmly held by the fixing portion 520. Two connection portions 530 and two fixing portion 520 may be extended from both ends of the top edge of the body 510, respectively. The two connection portions 530 and the two fixing portions 520 may also be extended from portions between both ends of the top edge of the body 510. The above construction allows for reduced interference with the source PCB 410 and efficient fixation of the PCB 410.

In one embodiment, the upper receiving member 600 covers the outer surface of the frame 300 to prevent inner components of the LCD device from moving and protect the outer edge of the LCD panel 100. When the upper receiving member 600 is combined to the frame 300, the coupling portion 540 is brought in contact with the upper receiving member 600, and the upper receiving member 600 is spaced by a prescribed distance from the source PCB 410 by the shield case 500, thereby preventing damage to the components installed on the source PCB 410. Conventionally, a separate insulating member has been used to prevent the upper receiving member 600 from contacting the components installed on the source PCB 410. However, the present disclosure does not need such a separate insulating member.

Moreover, the contact of the upper receiving member 600 and the shield case 500, which is made of a conductive material, enhances the ground effect. Thus, in one aspect, electromagnetic interference (EMI) may be reduced. Conventionally, a gasket has been attached to the source PCB 410 to enhance the ground effect so that the EMI may be reduced. However, the present disclosure may effectively eliminate the EMI without the need for a separate gasket.

Figure 2A:
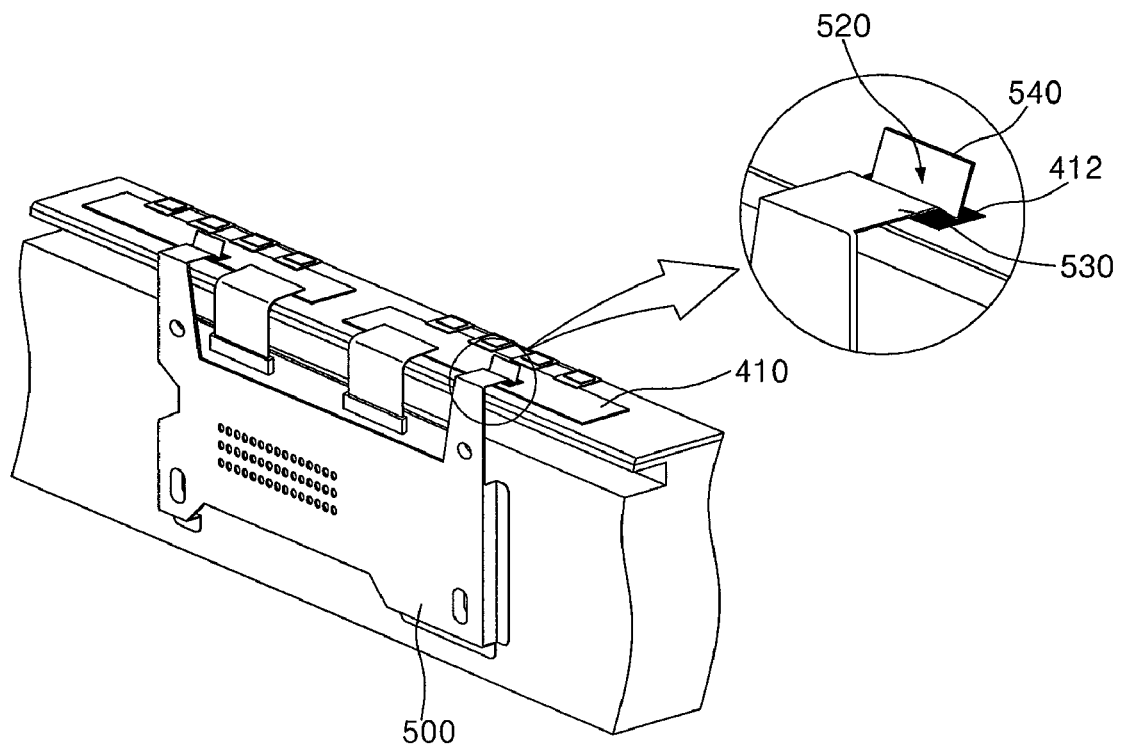
FIGS. 2A and 2B are a perspective view and a cross-sectional view illustrating an assembled LCD device according to an embodiment of the present disclosure.
Figure 2B:
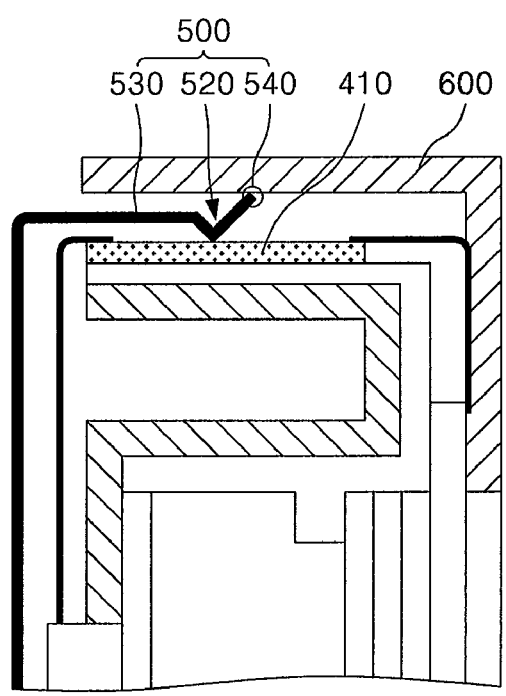

FIGS. 2A and 2B are a perspective view and a cross-sectional view illustrating an assembled LCD device according to one embodiment of the present disclosure. In particular, FIG. 2A shows the LCD device without the upper receiving member.

Referring to FIGS. 2A and 2B, the source PCB 410 is pressurized and firmly held by the fixing portion 520 of the shield case 500. The fixing portion 520 may make contact with a ground portion 412 provided on the source PCB 510. The ground portion 412 may be made of a conductive material and prevent the occurrence of EMI and static electricity from the source PCB 410. The tip of the fixing portion 520 is brought in contact with the upper receiving member 600 as shown in FIG. 2B.

Accordingly, in one implementation, the upper receiving member 600 may be spaced from the source PCB 410 by a prescribed distance, which may prevent the upper receiving member from contacting the components mounted on the source PCB 410. Moreover, enhanced ground effect resulting from the contact between the conductive shield case 500, the ground portion 412 and the upper receiving member 600 may further reduce the EMI generation.

Figure 3A:
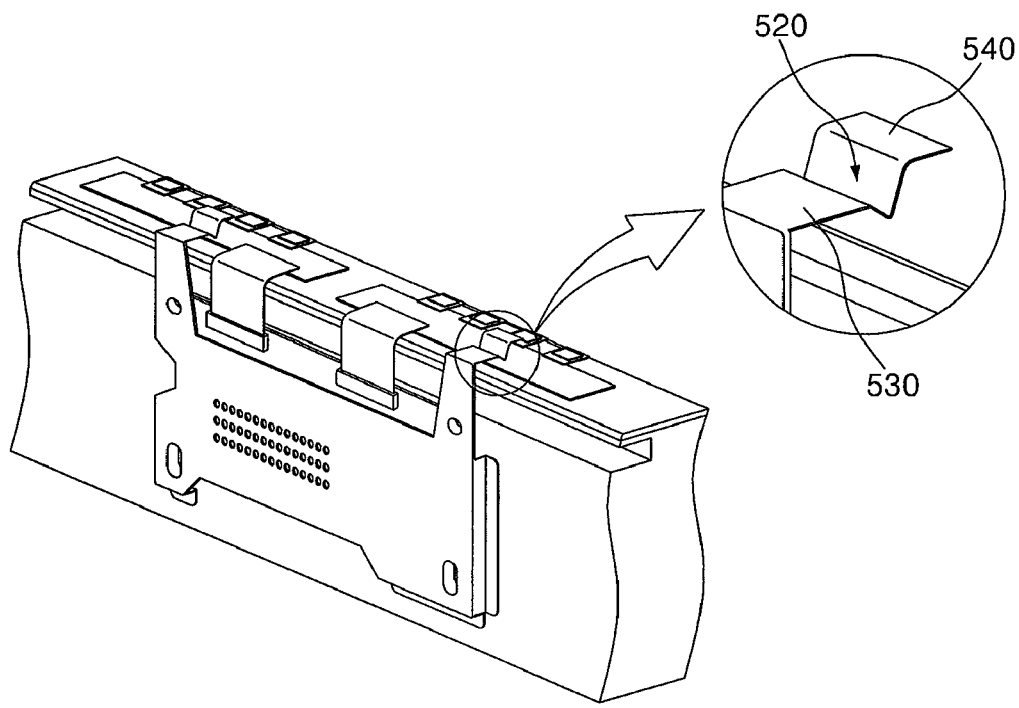
FIGS. 3A and 3B are a perspective view and a cross-sectional view illustrating the assembled LCD device according to an embodiment of the present disclosure.
Figure 3B:
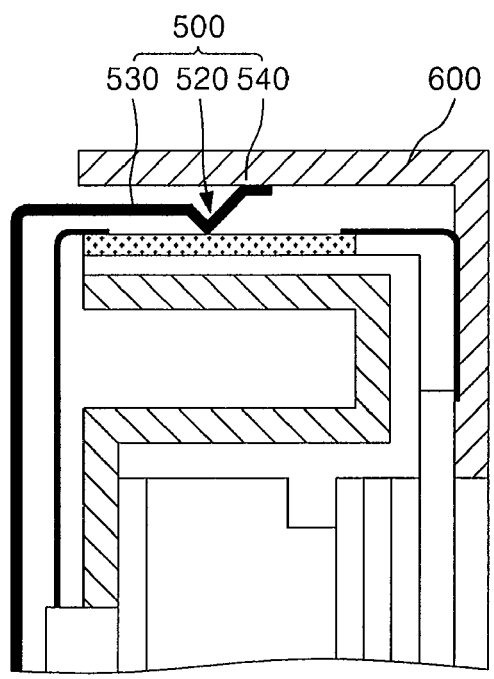

FIGS. 3A and 3B are a perspective view and a cross-sectional view illustrating the assembled LCD device according to one embodiment of the present disclosure. In particular, FIG. 3A shows the LCD device without the upper receiving member. To simplify the description, the components that are already described in the previous embodiments will not be described again. Like reference numerals refer to like components in different embodiments, Referring to FIGS. 3A and 3B, the coupling portion 540 of the shield case 500 is extended from an end of the fixing portion 520, so that its top surface is brought in contact with a surface of the upper receiving member 600, which faces the top surface of the coupling portion 540. This structure may increase the area of the coupling portion 540 contacting the upper receiving member 600, and therefore, the ground effect may be more enhanced to further reduce EMI generation. Components other than the coupling portion 540 have similar constructions as with previous embodiments.

Figure 4A:
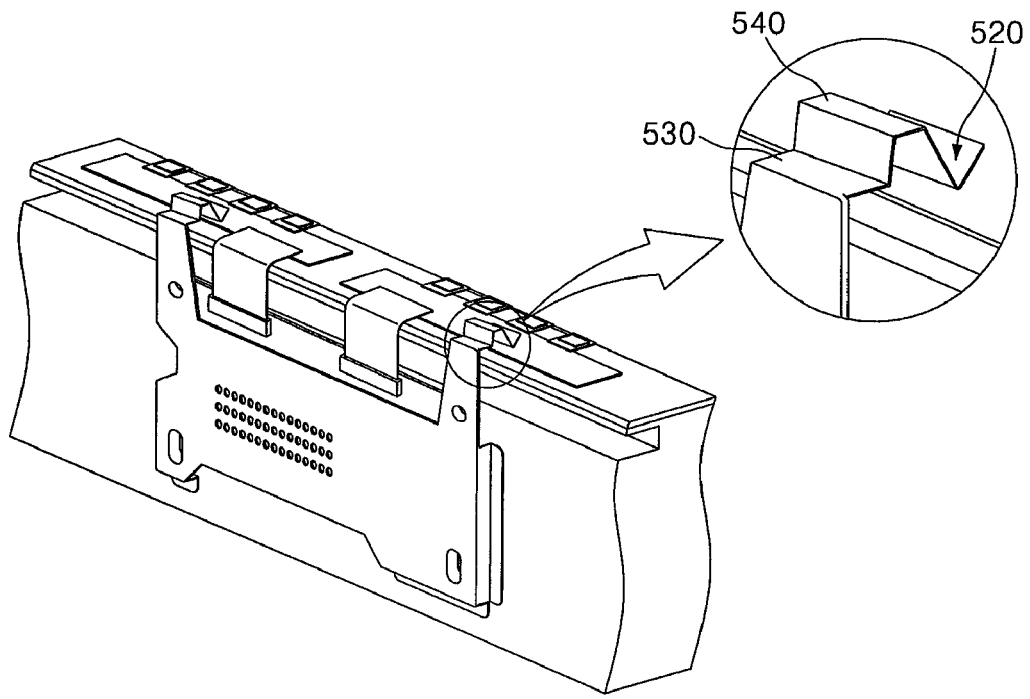
FIGS. 4A and 4B are a perspective view and a cross-sectional view illustrating the assembled LCD device according to an embodiment of the present disclosure.
Figure 4B:
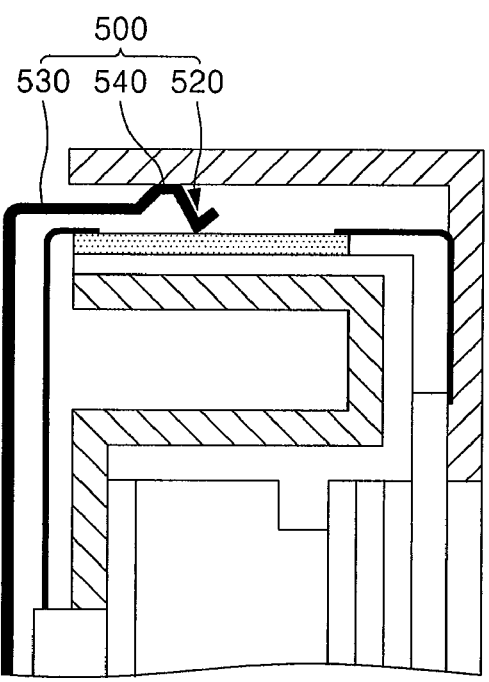

FIGS. 4A and 4B are a perspective view and a cross-sectional view illustrating the assembled LCD device according to one embodiment of the present disclosure. In particular, FIG. 4A shows the LCD device whose upper receiving member has not been combined.

Referring to FIGS. 4A and 4B, the coupling portion 540 is formed between the connection portion 530 and the fixing portion 520. It should be understood that the exact locations of the fixing portion 520 and the coupling portion 540 in the shield case 500 are not limitations of the invention, and may be changed as long as their locations do not limit the functions of the fixing portion 520 and coupling portions 540. Structural features other than that the coupling portion 540 located between the connection portion 530 and the fixing portion 520 may be similar to other embodiments.

Figure 5A:
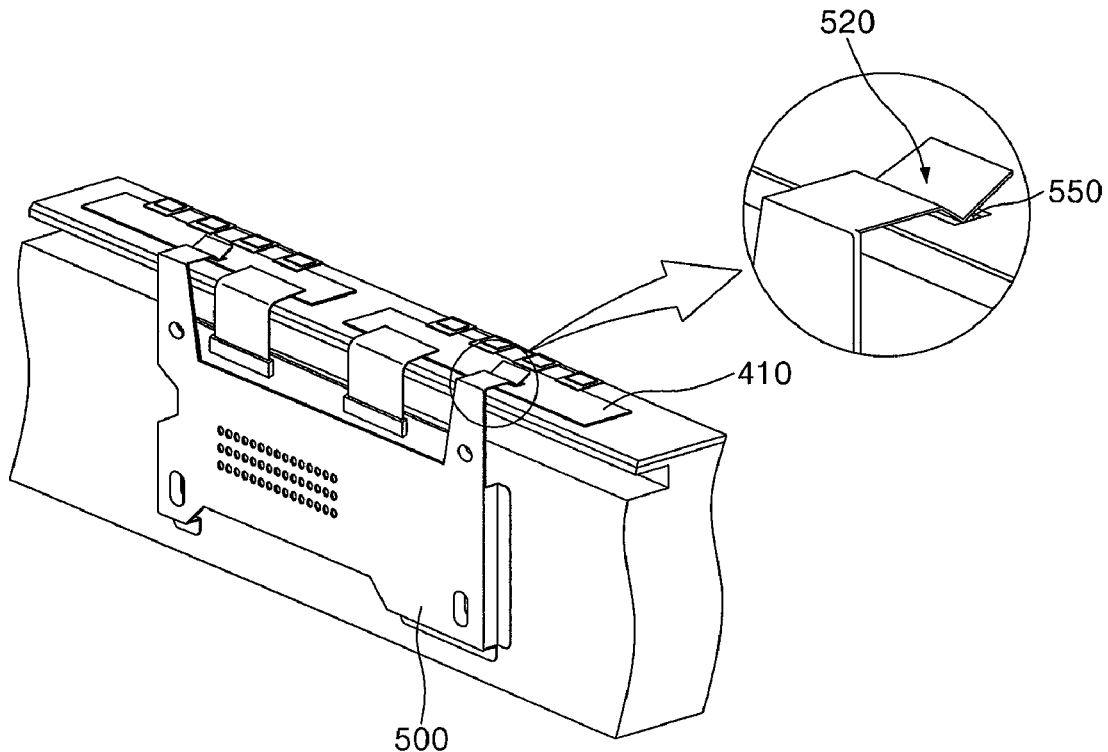
FIGS. 5A and 5B are a perspective view and a cross-sectional view illustrating the assembled LCD device according to an embodiment of the present disclosure.
Figure 5B:
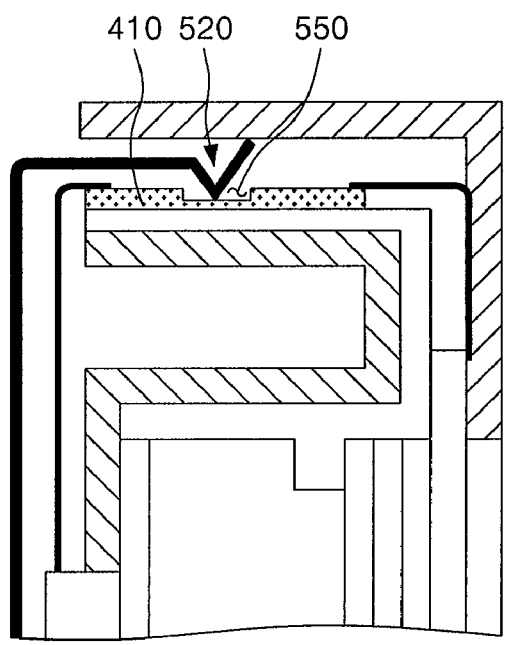

FIGS. 5A and 5B are a perspective view and a cross-sectional view illustrating the assembled LCD device according to one embodiment of the present disclosure. In particular, FIG. 5A shows the LCD device without the upper receiving member.

Referring to FIGS. 5A and 5B, the source PCB 410 includes a seating groove 550 on which the fixing portion 520 may rest. This seating groove 550 functions to allow the fixing portion 520 to stably engage with the source PCB 410. This structure may be applicable to various other embodiments disclosed herein.

Figure 6A:
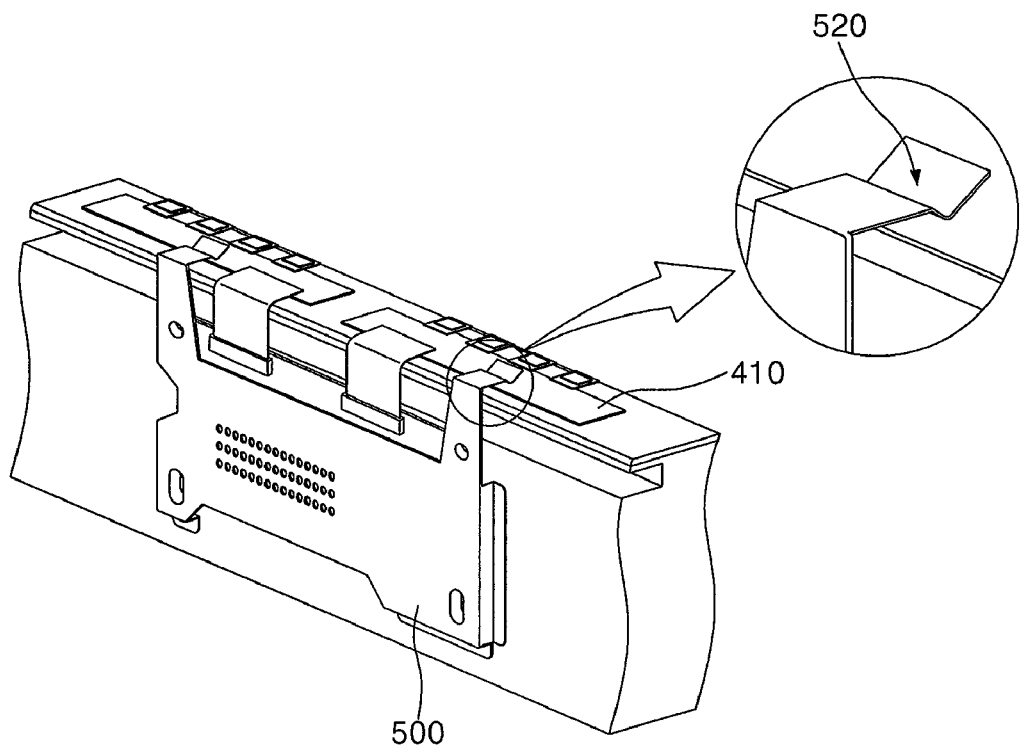
FIGS. 6A and 6B are a perspective view and a cross-sectional view illustrating the assembled LCD device according to an embodiment of the present disclosure.
Figure 6B:
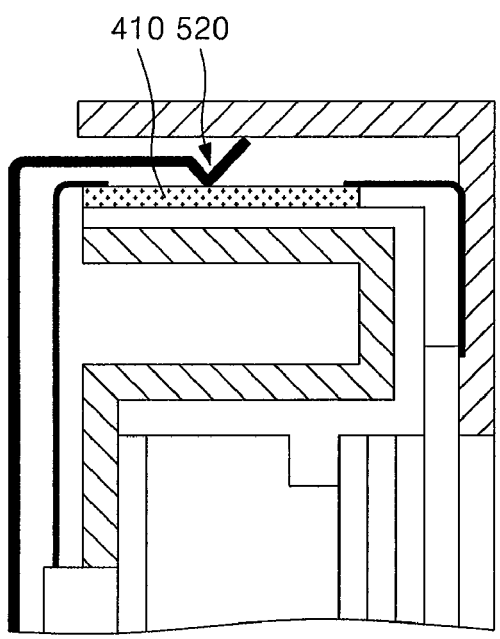
Figure 7:
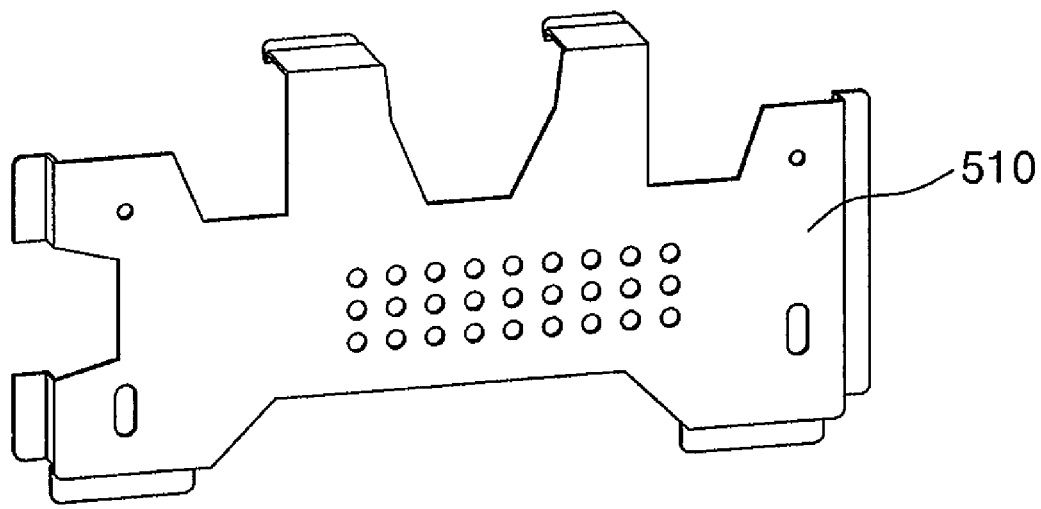
FIG. 7 is a perspective view illustrating a shield case according to an embodiment of the present disclosure.

FIGS. 6A and 6B are a perspective view and a cross-sectional view illustrating the assembled LCD device according to one embodiment of the present disclosure. In particular, FIG. 6A shows the LCD device without the upper receiving member.

Referring to FIGS. 6A and 6B, the fixing portion 520 may have a bend that is rounded. In one implementation, this structure may provide a more flexible combination of the fixing portion 520 and the source PCB 410. This rounded structure may be applicable to various other embodiments disclosed herein.

A method of manufacturing the LCD device will be described according to one embodiment of the present disclosure. The method includes combining the body 510 of the shield case 500 to the rear surface of the lower receiving member 350, placing the source PCB 410 between the fixing portion 520 and the side of the lower receiving member 350, and combining the lower receiving member 350 with the upper receiving member 600.

In one implementation, the coupling member 522 is screwed into the first to third penetration holes 521, 455, and 351 to combine the body 510 to the rear surface of the lower receiving member 350. As such, the connection portion 530 and fixing portion 520 pressurize the side of the lower receiving member 350 by their tension.

In one implementation, the source PCB 410 may be press-fittingly inserted between the fixing portion 520 and the side of the lower receiving member 350. As such, the source PCB may be firmly held by the fixing portion 520.

In one embodiment, the upper receiving member 600 is combined with the lower receiving member 350 so that the upper receiving member 600 covers the periphery of the lower receiving member 350 to protect the LCD panel. As such, the coupling portion 540 is brought in contact with the surface of the upper receiving member that faces the coupling portion 540, which may enhance ground effect.

As described above, embodiments of the present disclosure provide a shield case that may prevent the source PCB from coming off the LCD device. Accordingly, the degradation in display quality may be prevented. Moreover, the contact between the shield case and the upper receiving member may enhance the ground effect, further reducing EMI generation.

Although the present disclosure has been described with reference to various embodiments disclosed herein, it will be understood by those skilled in the art that a variety of modifications and variations may be made to the present disclosure without departing from the scope of the present disclosure defined in the appended claims and their equivalents.

What is claimed is:
1. A liquid crystal display device comprising:
a liquid crystal display panel for displaying images;
a lower receiving member receiving the liquid crystal display panel;
a source PCB disposed on a side surface of the lower receiving member to supply a driving signal to the liquid crystal display panel;
a shield case including a body which is arranged on a rear surface of the lower receiving member and which protects a driving board on which a component is mounted to supply a driving signal to the source PCB, a fixing portion that presses a substantially planar portion of the source PCB toward the lower receiving member so as to fix the source PCB to the side surface of the lower receiving member, and a connection portion that is extended from the body toward the fixing portion to connects the body to the fixing portion; and an upper receiving member combined with the lower receiving member to cover the liquid crystal display panel, wherein the connection portion is extended from an edge of the shield case, wherein the source PCB is placed between the fixing portion of the shield case and the side surface of the lower receiving member.

2. The liquid crystal display device of claim 1, wherein the shield case further comprises a coupling portion contacting the upper receiving member.

3. The liquid crystal display device of claim 2, wherein the coupling portion extends from an end of the fixing portion.

4. The liquid crystal display device of claim 2, wherein the coupling portion is formed between the connection portion and the fixing portion.

5. The liquid crystal display device of claim 1, wherein the source PCB comprises a seating groove on which the fixing portion rests.

6. The liquid crystal display device of claim 1, wherein the fixing portion has a rounded bend.

7. The liquid crystal display device of claim 1, wherein the source PCB has a ground portion, and wherein the ground portion makes contact with the fixing portion when the source PCB is disposed on the side of the lower receiving member.

8. The liquid crystal display device of claim 1, wherein the connection portion extends from a portion between both ends of a top edge of the shield case.

9. The liquid crystal display device of claim 1, further comprising: a backlight assembly disposed in the lower receiving member; and a frame wrapping around an outer surface of the lower receiving member to prevent the backlight assembly from coming off.

10. A method of manufacturing a liquid crystal display device, the method comprising:

receiving a liquid crystal panel into a lower receiving member;

placing a source PCB on a side surface of the lower receiving member to supply a driving signal to the liquid crystal display panel;

combining a shield case with a lower receiving member, the shield case including a body that is arranged on a rear surface of the lower receiving member and that protects a driving board on which a component is mounted to supply a driving signal to a source PCB, a fixing portion that presses a substantially planar portion of the source PCB toward the lower receiving member so as to fix the source PCB to the side surface of the lower receiving member, and a connection portion that is extended from the body toward the fixing portion to connect the body to the fixing portion;

and combining the lower receiving member with an upper receiving member, wherein the source PCB is placed between the fixing portion of the shield case and the side surface of the lower receiving member.

11. The method of claim 10, wherein the shield case further comprises a coupling portion which contacts the upper receiving member.

12. The method of claim 11, wherein the coupling portion extends from an end of the fixing portion.

13. The method of claim 11, wherein the coupling portion is formed between the connection portion and the fixing portion.

14. The method of claim 10, wherein the source PCB comprises a seating groove on which the fixing portion is rested.

15. The method of claim 10, wherein the fixing portion has a rounded bend.

16. The method of claim 10, wherein the source PCB has a ground portion, and wherein the ground portion is brought in contact with the fixing portion when the source PCB is seated on the side of the lower receiving member.

17. The method of claim 10, wherein the connection portion is extended from a portion between both ends of a top edge of the shield case.

* * * * *